(12) United States Patent
Kim et al.

(10) Patent No.: US 7,523,382 B2
(45) Date of Patent: Apr. 21, 2009

(54) APPARATUS AND METHOD FOR GENERATING AND DECODING FORWARD ERROR CORRECTION CODES HAVING VARIABLE RATE IN A HIGH-RATE WIRELESS DATA COMMUNICATION SYSTEM

(75) Inventors: Min-Goo Kim, Yongin-si (KR); Sang-Hyuck Ha, Suwon-si (KR); Young-Mo Gu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 799 days.

(21) Appl. No.: 11/038,183

(22) Filed: Jan. 21, 2005

(65) Prior Publication Data
US 2005/0160347 A1    Jul. 21, 2005

(30) Foreign Application Priority Data
Jan. 20, 2004    (KR) .................. 10-2004-0004246

(51) Int. Cl.
*H03M 13/00* (2006.01)
(52) U.S. Cl. .................. 714/776; 714/786; 714/755; 714/790
(58) Field of Classification Search .......... 714/776, 714/786, 755, 790
See application file for complete search history.

(56) References Cited

U.S. PATENT DOCUMENTS 6,473,878 B1 * 10/2002 Wei .................... 714/755

7,460,608 B2 * 12/2008 Cameron et al. .......... 375/265
2003/0079170 A1 *  4/2003 Stewart et al. ............ 714/755

FOREIGN PATENT DOCUMENTS

EP          1 233 524 A2    8/2002
KR    10-2002-0065866 A    8/2002

(Continued)

OTHER PUBLICATIONS

Yannick Saouter, "Decoding M-binary Turbo Codes By The Dual Method", Information Theory Workshop, 2003. Proceedings, 2003 IEEE Mar. 31-Apr. 4, 2003, pp. 74-77.

(Continued)

*Primary Examiner*—Guy J Lamarre
(74) *Attorney, Agent, or Firm*—Roylance, Abrams, Berdo & Goodman, LLP

(57) ABSTRACT

An apparatus for generating Quasi-Complementary Duo-Binary Turbo Codes (QC-DBTC). The apparatus includes a QC-DBTC encoder which receives an information symbol stream and generates a plurality of systematic symbol streams and a plurality of parity symbol streams according to a given code rate. The apparatus further includes a quad-symbol mapper which quad-maps the systematic symbol streams to one symbol stream, a channel interleaver which independently interleaves the quad-mapped systematic symbol stream and the parity symbol streams, quad-demaps the quad-mapped systematic symbol stream, interlaces symbols in parity symbol streams, and serial-concatenates the quad-demapped systematic symbol stream to the interlaced parity symbol streams. A duo-binary turbo code generator is further provided to repeat the serial-concatenated symbol stream, and select a predetermined number of symbols from the repeated symbol stream according to a code rate and selection information, thereby generating QC-DBTC codes.

15 Claims, 8 Drawing Sheets

FOREIGN PATENT DOCUMENTS

| KR | 10-2002-0066998 A | 8/2002 |
|---|---|---|
| KR | 10-2002-0067382 A | 8/2002 |
| KR | 10-2002-0085854 A | 11/2002 |
| WO | WO 02/065647 A1 | 8/2002 |

OTHER PUBLICATIONS

Yannick Saouter et al., "Fast SUBMAP Decoders For Duo-Binary Turbo-Codes", Circuits And Systems For Communications, 2002. Proceedings, ICCSC '02. 1st IEEE International Conference On Jun. 26-28, 2002, pp. 150-153.

Yannick Saouter et al., "Fast Soft-Output Viterbi Decoding For Duo-Binary Turbo Codes", Circuits And Systems, 2002. ISCAS 2002. IEEE International Symposium On vol. 1, May 26-29, 2002, pp. I-885-I-888.

Claude Berrou et al., "The Advantages Of Non-Binary Turbo Codes", Information Theory Workshop, 2001. Proceedings, 2001 IEEE Sep. 2-7, 2001, pp. 61-63.

Jun Tan et al., "Soft Output Viterbi Algorithm (SOVA) For Non-Binary Turbo Codes", Information Theory, 2000. Proceedings, IEEE International Symposium On Jun. 25-30, 2000, p. 483.

Jun Tan et al., "A MAP Equivalent SOVA For Non-Binary Turbo Codes", Communications, 2000. ICC 2000, 2000 IEEE International Conference On vol. 2, Jun. 18-22, 2000, pp. 602-606.

Min-Goo Kim et al., "Quasi-Complementary Turbo Codes (QCTC) For Applications In High-Data-Rate Systems", Proceedings of the 57th IEEE Semiannual Vehicular Technology Conference, 2003, (VTC 2003-Spring), Apr. 22-25, 2003, pp. 2381-2385, vol. 4, IEEE.

* cited by examiner

APPARATUS AND METHOD FOR GENERATING AND DECODING FORWARD ERROR CORRECTION CODES HAVING VARIABLE RATE IN A HIGH-RATE WIRELESS DATA COMMUNICATION SYSTEM

CROSS-REFERENCE TO RELATED APPLICATIONS

This application claims the benefit under 35 U.S.C. §119 (a) of Korean Patent Application No. 10-2004-0004246 entitled "Apparatus and Method for Generating and Decoding Forward Error Correction Codes Having Variable Rate in a High-Rate Wireless Data Communication System" filed in the Korean Intellectual Property Office on Jan. 20, 2004, the entire contents of which are incorporated herein by reference.

BACKGROUND OF THE INVENTION

1. Field of the Invention

The present invention relates generally to an apparatus and method for generating Forward Error Correction (FEC) codes in a wireless data communication system. More particularly, the present invention relates to an apparatus and method for generating FEC codes having a variable rate.

2. Description of the Related Art

In general, wireless data communication systems are classified as a Mobile Communication System (MCS), Wireless Local Area Network (WLAN), Wide Area Network (WAN) or Metropolitan Area Network (MAN), all of which are based on mobile communication technology. For the Mobile Communication System, systems for high-speed data transmission are also being developed independently by $3^{rd}$ Generation Partnership Project-2 (3GPP2), a standardization group for a synchronous Code Division Multiple Access (CDMA) mobile communication system, and $3^{rd}$ Generation Partnership Project (3GPP), a standardization group for an asynchronous Universal Mobile Telecommunications System (UMTS) mobile communication system. Also, for WLAN, WAN and MAN, various attempts are also being made to transmit radio data at a high rate in the area of IEEE 802.11 to IEEE 802.16 standardization.

A description will now be made of Adaptive Modulation & Coding (AMC) as attempted in the foregoing communication standards. Also, a description will be made of an IEEE 802.16a system, a CDMA2000 1×EV-DV (Evolution with Data and Voice) system based on the CDMA mobile communication system, and a High speed Portable Internet (HPi) system currently being developed in South Korea for high-speed data transmission in a 2.4 GHz band, all of which comprise the most substantially advanced systems in the related technical field.

First, an IEEE 802.16a system will be described. The IEEE 802.16a system is a system using Orthogonal Frequency Division Multiple Access (OFDMA).

FIG. 1 is a block diagram illustrating the structures of physical channels for transmitting high-rate data in an IEEE 802.16a system using Orthogonal Frequency Division Multiplexing (OFDM). Referring to FIG. 1, all of the physical channels transmitted to users User1, User2, ..., Userm have the same structure. Therefore, in FIG. 1, the same elements are assigned the same reference numerals, and different letters such as a, b, ..., m are added to the ends of the reference numerals as indicators for indicating the respective users and their associated physical channels. Parameters used in the physical channels for the users User1, User2, ..., Userm can have either the same values or different values. For example, the respective physical channels can be different from one another in input packet size, code rate, modulation order and transmission duration. A description will now be made of a physical channel for a first user User1, by way of example.

In a physical channel, data User1_Data to be transmitted to a first user User1 is input to a Cyclic Redundancy Check (CRC) adder 101a, and the CRC adder 101a adds a CRC to the input user data User1_Data so that a reception side can detect an error occurring due to noises in a channel transmission process. The CRC-added user data is input to a tail bit adder 103a, and the tail bit adder 103a adds tail bits to the CRC-added user data. The CRC is an error correction code used for correcting an error occurring due to noises in a channel transmission process, and is generally used for Forward Error Correction (FEC). Generally, convolutional codes or turbo codes are used for the FEC used in a wireless communication system. These codes use tail bits which are termination bits for terminating the corresponding codes at a '0' state on a trellis diagram. Therefore, the tail bit-added data is FEC-encoded by an FEC encoder 105a. As this is well disclosed in the related references, a detailed description thereof will be omitted herein.

Next, in order to match the number of output signals of the FEC encoder 105a to the number of modulation symbols allocated to each user, a symbol repetition & puncturing part 107a performs symbol repeating and puncturing on the FEC-encoded data. The symbols that underwent repetition and puncturing are input to a channel interleaver 109a for converting a burst error occurring in the channel into a random error, and the channel interleaver 109a channel-interleaves the input symbols. The channel-interleaved symbols are input to a modulator 111a, and the modulator 111a modulates the channel-interleaved symbols. The modulated symbols are input to a subcarrier or subchannel mapper and an NOS or NOOS mapper 120. The subcarrier or subchannel mapper and the NOS or NOOS mapper 120 performs subcarrier or subchannel mapping, and NOS (Number of Slots) or NOOS (Number of OFDM Symbols) mapping on the modulated symbols for a transmission duration allocated to each user. The subcarrier or subchannel mapper and the NOS or NOOS mapper 120 simultaneously processes data for all users. The symbols output from the subcarrier or subchannel mapper and the NOS or NOOS mapper 120 are input to an inverse fast Fourier transform (IFFT) 130, and the IFFT 130 performs inverse fast Fourier transform on the input symbols. In this way, data for each user is converted into one carrier signal and delivered to a radio frequency (RF) unit (not shown).

In the foregoing description, "NOS" or "NOOS" designates a transmission duration allocated to each user, and is variable according to a size of user data. Therefore, an increase in NOS or NOOS causes an increase in transmission time allocated to one packet. In addition, "subchannel" designates a set of subcarriers used in Orthogonal Frequency Division Multiplexing (OFDM). It is not necessary that the subcarriers constituting one subchannel should always be arranged in a regular sequence in a frequency domain, and it is typical that multiple subcarriers constitute one subchannel according to a particular pattern. For example, when a given frequency bandwidth is divided into 2048 orthogonal frequencies, if there are $1^{st}$ to $2048^{th}$ subcarriers, one subchannel can be configured with 4 subcarriers of $1^{st}$, $8^{th}$, $16^{th}$, $32^{nd}$ and $64^{th}$ subcarriers. The configuration of a subchannel and the number of subcarriers constituting the subchannel are subject to change according to standards.

FIG. 2 is a block diagram illustrating structures of physical channels for transmitting data to a user in a current HPi high-rate data system. FIG. 2 is substantially identical in structure to that of FIG. 1 except that the structure of FIG. 2 does not add CRC and tail bits. This is because the CRC function can be performed in a Medium Access Control (MAC) layer. Therefore, elements 205, 207, 209, 211, 220 and 230 in FIG. 2 correspond to the elements 105, 107, 109, 111, 120 and 130 of FIG. 1, respectively. When the structures of both FIGS. 1 and 2 have multiple modulators and multiple FEC code rates, they require a scheme for determining a code rate and a modulation order for guaranteeing each user the best performance.

As illustrated in FIGS. 1 and 2, in a physical channel for a packet transmission service, a modulator is necessary. In addition, FEC codes are used in order to overcome data errors caused by noises occurring in a radio communication channel. However, in the current physical channel for a packet transmission service, FEC codes with a fixed rate are generally used and in particular, the best codes for a given rate are used. This is because the physical channel for a packet transmission service has a characteristic of a stationary channel, such as an Additive White Gaussian Noise (AWGN) channel. Therefore, there is less necessity to take the FEC codes using an adaptive rate into consideration. For example, IEEE 802.16a, a high-rate wireless data service standard, does not guarantee mobility of a mobile station and uses only 6 FEC code rates. A detailed description of the standard is well disclosed in the IEEE 802.16a physical channel standard, the entire contents of which are incorporated herein by reference. While the mobile communication system uses binary turbo codes, the IEEE 802.16a uses duo-binary turbo codes.

The duo-binary turbo codes will now be described in greater detail. FIG. 3 is a block diagram illustrating an apparatus for generating rate R=1/2 duo-binary turbo codes, and FIG. 4 is a block diagram illustrating an apparatus for generating R=1/3 duo-binary turbo codes.

As illustrated in FIG. 3, an R=1/2 duo-binary turbo encoder receives 2 information symbols A and B in parallel. The 2 information symbols A and B received in parallel are input in common to a first constituent encoder 301 and a turbo interleaver 302. The turbo interleaver 302 interleaves the 2 parallel input information symbols A and B, and outputs the interleaved information symbols to a second constituent encoder 303. The 2 parallel input information symbols A and B are output intact as systematic symbols, and the first constituent encoder 301 and the second constituent encoder 303 generate parity symbols C1 and C2, respectively, using the 2 input information symbols A and B. As a result, the 2 input information symbols are output intact as systematic symbols, and each constituent encoder generates one parity symbol. Therefore, a code rate of the encoder is 1/2.

An R=1/3 duo-binary turbo encoder of FIG. 4 receives 2 information symbols A and B in parallel. The 2 parallel input information symbols A and B are input in common to a first constituent encoder 401 and a turbo interleaver 402. The turbo interleaver 402 interleaves the 2 parallel input information symbols A and B, and outputs the interleaved information symbols to a second constituent encoder 403. The 2 parallel input information symbols A and B are output intact as systematic symbols, and the first constituent encoder 401 and the second constituent encoder 403 generate parity symbol pairs C11; C12 and C21; C22, respectively, using the 2 input information symbols A and B. As a result, the 2 input information symbols are output intact as systematic symbols, and each constituent encoder generates two parity symbols. Therefore, a code rate of the encoder is 1/3.

A description will now be made of an encoding method performed in the duo-binary turbo encoders of FIGS. 3 and 4.

It will be assumed that a size of an information symbol to be encoded is N_EP, and N_EP/2 information symbol pairs that are generated by halving the size N_EP information symbol are denoted by A_i and B_i (wherein i=0, 1, . . . , N_EP/2), respectively. In this case, the duo-binary turbo encoder encodes a symbol pair A_i and B_i by a first constituent encoder 301 (or 401) and outputs a parity symbol C1 (or a parity symbol pair C11;C12) as the encoding result. Next, the turbo interleaver 302 (or 402) interleaves the N_EP/2 information symbol pairs A_i and B_i, and outputs the interleaved information symbol pairs to a second constituent encoder 303 (or 403). The second constituent encoder 303 (or 403) encodes the input information symbol pairs, and outputs a parity symbol C2 (or a parity symbol pair C21; C22) as the encoding result. As a result, for N_EP input information symbols, the R=1/2 duo-binary turbo encoder outputs 2N_EP codeword symbols and the R=1/3 duo-binary turbo encoder outputs 3N_EP codeword symbols.

It is generally known to those skilled in the art that the duo-binary turbo codes are slightly superior to the binary turbo codes in performance gain at a high code rate. When compared with the binary turbo codes whose information symbol size is N_EP, the duo-binary turbo codes whose information symbol size is also N_EP, are reduced to 1/2 in trellis length, that is, frame length, contributing to a 1/2 reduction in decoding delay. Disadvantageously, however, the duo-binary turbo codes are inferior to the binary turbo codes in performance at a lower code rate. In addition, the duo-binary turbo codes are higher than the binary turbo codes in terms of decoding complexity, because 4 branches are used for each state in a trellis diagram.

However, CDMA2000 1x EV-DV (Evolution with Data and Voice), a synchronous mobile communication standard, guarantees mobility of a mobile station. For a system to guarantee mobility, not only should data error caused by noises occurring in a wireless communication channel be taken into consideration, but also various schemes for overcoming a data error caused by fading should be taken into consideration. For example, in order for a transmitter to actively cope with a dynamic change in signal-to-noise ratio (SNR) occurring in a fading channel environment, a packet modulation scheme of transmitting the same transmission packet at all times and an AMC scheme of varying a code rate of FEC codes are extensively considered. For example, in CDMA2000 1x EV-DV, Quasi-Complementary Turbo Codes (QCTC) are used for a physical channel as a scheme for freely supporting a variable code rate. The QCTC designates a set of turbo codes with various code rates selected by a symbol selector after code symbols, encoded from a given mother code according to a specific rule, are rearranged as shown in FIG. 5.

With reference to FIG. 5, a description will now be made of an operation of QCTC selected as a standard for a CDMA2000 1x EV-DV system. When an information stream 500 is input to a turbo encoder 510 having a rate R=1/5, the turbo encoder 510 performs turbo coding on N_EP input information symbols using a mother code. As a result, the turbo encoder 510 generates 5×N_EP code symbols. The generated code symbols are demultiplexed into 5 sub-blocks by a code symbol separator 512. The separated code symbols are denoted by reference numeral 514. The code symbols 514 are divided into a systematic symbol group (or sub-block X) and a plurality of parity symbol groups (or sub-blocks Y0, Y1, Y'0 and Y'1). The respective symbol groups undergo Partial Bit Reversal Order (PBRO) interleaving. Here, the respective sub-blocks undergo independent interleaving. This is called "sub-block interleaving." Reference numerals 516a, 516b, 516c, 516d and 516e denote independent devices for performing the PBRO interleaving.

Among the PBRO-interleaved symbols, systematic symbols are output intact, and the PBRO-interleaved parity symbols are interlacedly rearranged by interlacers 518a and 518b. The rearrangement is achieved in such a manner that two symbols are interlaced once. That is, the interlacer 518a forms a new group by interlacing parity symbols Y0 and Y'0. Similarly, the interlacer 518b interlacedly rearranges parity symbols Y1 and Y'1 generated in each sub-block, thereby forming a new group. Therefore, each group generated by interlacing has a size of 2×N_EP.

Next, the sub-block comprised of interleaved systematic symbols and the 2 interlaced parity groups are arranged in a regular order and then concatenated, thus generating one new sequence. Here, this operation is denoted by "QCTC Symbols" and reference numeral 520. Through a series of the processes described above, symbol rearrangement for generating QCTC codes is completed. Next, a QCTC symbol selector 522 generates QCTC codes having various code rates by selecting random symbols from 5×N_EP symbols. A conventional binary QCTC design criteria is to take performance improvements of a received signal in a fading channel into consideration. The QCTC design criteria are characterized by optimizing not only code performance, but also channel interleaving performance. The channel interleaving is generally achieved by sub-block interleaving and interlacing.

According to the current HPi standard, there are some 120 possible different combinations of modulation schemes and FEC code rates. However, there is no proposed scheme for generating and determining FEC codes supporting the possible combinations, that is, turbo codes having various code rates. Particularly, an OFDM/OFDMA system has no proposed method for varying an FEC code rate according to a relation between a modulation scheme and an FEC code rate corresponding to each data rate. In addition, when Hybrid Automatic Repeat Request (HARQ) is used, there is no proposed scheme for generating various redundancies.

For the binary turbo codes used in a mobile communication system, that is, binary turbo codes defined in the CDMA2000 1x EV-DV standard, QCTC has been proposed as a scheme for providing various codes in the foregoing environments. However, QCTC is basically optimized for binary turbo codes. Therefore, separate optimization is required when non-binary turbo codes such as duo-binary turbo codes are used as mother codes. In particular, the use of the duo-binary turbo codes requires symbol classification and interleaving in which a characteristic of systematic symbols are taken into consideration.

Accordingly, a need exists for an apparatus and method for generating desired codes and for decoding the desired codes in a high-rate wireless data system.

SUMMARY OF THE INVENTION

It is, therefore, an object of the present invention to provide an apparatus and method for generating Quasi-Complementary Duo-Binary Turbo Codes (QC-DBTC), and an apparatus and method for decoding the QC-DBTC codes in a high-rate wireless data system in which various packet sizes are used for data transmission.

It is another object of the present invention to provide an apparatus and method for generating duo-binary turbo codes having various code rates, and an apparatus and method for decoding the duo-binary turbo codes in an OFDMA high-rate wireless packet data communication system in which HARQ is used.

It is another object of the present invention to provide an apparatus and method for generating duo-binary turbo codes, and an apparatus and method for decoding the duo-binary turbo codes in an OFDMA high-rate wireless packet data communication system in which various packet sizes are used, and wherein one of multiple modulation schemes and one of multiple FEC coding schemes are selected according to a channel state, a buffer state, the number of available subchannels (or subcarriers), the number of OFDM symbols, and a transmission duration.

In accordance with a first aspect of the present invention, there is provided an apparatus for generating subpackets. The apparatus comprises a encoder for encoding information symbols, wherein the information symbols are fed alternatively to two input ports of the encoder; a symbol separator for demultiplexing all of the encoded symbols into two systematic symbol subblocks and two pairs of parity symbol subblocks; a channel interleaver for separately interleaving the subblocks; a symbol group generator for generating the first symbol-by-symbol multiplexed sequence of one pair of the interleaved parity symbol subblocks, the second symbol-by-symbol multiplexed sequence of another pair of the interleaved parity symbol subblocks and two systematic sequences of two interleaved systematic symbol subblocks; and a symbol selector for selecting a predetermined number of symbols from the two systematic sequences, the first symbol-by-symbol multiplexed sequence and the second symbol-by-symbol multiplexed sequence.

In accordance with a second aspect of the present invention, there is provided a method for generating subpackets. The method comprises the steps of: encoding information symbols, wherein the information symbols are fed alternatively to two input ports of an encoder; demultiplexing all of the encoded symbols into two systematic symbol subblocks and two pairs of parity symbol subblocks; separately interleaving the subblocks; generating the first symbol-by-symbol multiplexed sequence of one pair of the interleaved parity symbol subblocks, the second symbol-by-symbol multiplexed sequence of another pair of the interleaved parity symbol subblocks and two systematic sequences of two interleaved systematic symbol subblocks; and selecting a predetermined number of symbols from the two systematic sequences, the first symbol-by-symbol multiplexed sequence and the second symbol-by-symbol multiplexed sequence.

In accordance with a third aspect of the present invention, there is provided an apparatus for generating Quasi-Complementary Duo-Binary Turbo Codes (QC-DBTC). The apparatus comprises a duo-binary turbo encoder having a plurality of constituent encoders for receiving an information symbol stream, and for generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders; a quad-symbol mapper for quad-mapping the systematic symbol streams to one symbol stream; a channel interleaver for independently interleaving the quad-mapped systematic symbol stream and the parity symbol streams from the constituent encoders, quad-demapping the quad-mapped systematic symbol stream, interlacing symbols in the parity symbol streams corresponding to each other from among the interleaved parity symbol streams, and serial-concatenating the quad-demapped systematic symbol stream to the interlaced parity symbol streams; and a duo-binary turbo code generator for repeating the serial-concatenated symbol stream, and for selecting a predetermined number of symbols from the repeated symbol stream according to a code rate and selection information thereby generating QC-DBTC codes.

In accordance with a fourth aspect of the present invention, there is provided a method for generating Quasi-Complementary Duo-Binary Turbo Codes (QC-DBTC). The method comprises the steps of: receiving an information symbol stream and generating a plurality of systematic symbol streams and a plurality of parity symbol streams according to a given code rate; separating the generated symbol streams into systematic symbol streams and parity symbol streams; quad-mapping the separated systematic symbol streams to one symbol stream; independently interleaving the quad-mapped symbol stream and the parity symbol streams; quad-demapping the interleaved systematic symbol stream; interlacing the parity symbol streams in pairs; concatenating the interlaced parity symbol streams to the quad-demapped systematic symbol stream; and selecting symbols to be transmitted according to a given data rate from the concatenated symbols.

In accordance with a fifth aspect of the present invention, there is provided an apparatus for generating code symbols by encoding an information symbol stream according to a given code rate using a Quasi-Complementary Duo-Binary Turbo Code (QC-DBTC) encoder and selecting all or some of the code symbols to be transmitted from among the generated code symbols. The apparatus comprises a QC-DBTC encoder for receiving an information symbol stream and generating QC-DBTC symbols according to a predetermined code rate; a separator for separating output symbols of the QC-DBTC encoder into a plurality of systematic symbol streams and a plurality of parity symbol streams, the systematic symbol streams being connected into one symbol stream; a plurality of interleavers for independently interleaving the parity symbol streams; a systematic symbol stream interleaver for interleaving the connected systematic symbol stream; an interlacer for interlacing the parity symbol streams in pairs; a concatenator for serial-concatenating an output of the systematic symbol stream interleaver to an output of the interlacer; and a symbol selector for selecting symbols to be transmitted according to a given data rate from the concatenated symbols.

In accordance with a sixth aspect of the present invention, there is provided a method for generating code symbols by encoding an information symbol stream according to a given code rate using a Quasi-Complementary Duo-Binary Turbo Code (QC-DBTC) encoder and selecting all or some of the code symbols to be transmitted from among the generated code symbols. The method comprises the steps of receiving an information symbol stream and generating QC-DBTC symbols according to a predetermined code rate; separating output symbols of the QC-DBTC encoder into a plurality of systematic symbol streams and a plurality of parity symbol streams, the systematic symbol streams being connected into one symbol stream; independently interleaving the parity symbol streams; interleaving the connected systematic symbol stream; interlacing the parity symbol streams in pairs; serial-concatenating the interleaved systematic symbol stream to the interlaced parity symbol streams; and selecting symbols to be transmitted according to a given data rate from the concatenated symbols.

In accordance with a seventh aspect of the present invention, there is provided an apparatus for generating code symbols by encoding an information symbol stream according to a given code rate using a Quasi-Complementary Duo-Binary Turbo Code (QC-DBTC) encoder and selecting all or some of the code symbols to be transmitted from among the generated code symbols. The apparatus comprises a QC-DBTC encoder having a plurality of constituent encoders for receiving an information symbol stream, and for generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders; a separator for separating an output of the QC-DBTC encoder into systematic symbol streams and parity symbol streams; a plurality of interleavers for independently interleaving the systematic symbol streams and the parity symbol streams; an interlacer for interlacing in pairs, the parity symbol pairs generated from different constituent encoders; a concatenator for serial-concatenating the interleaved systematic symbol streams to the interlaced parity symbol streams; and a symbol selector for selecting symbols to be transmitted according to a given data rate from the concatenated symbols.

In accordance with an eighth aspect of the present invention, there is provided a method for generating code symbols by encoding an information symbol stream according to a given code rate using a Quasi-Complementary Duo-Binary Turbo Code (QC-DBTC) encoder and selecting all or some of the code symbols to be transmitted from among the generated code symbols. The method comprises the steps of receiving, by the QC-DBTC encoder, the an information symbol stream, and generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders; separating an output of the QC-DBTC encoder into systematic symbol streams and parity symbol streams; independently interleaving the systematic symbol streams and the parity symbol streams; interlacing the parity symbol pairs in pairs; concatenating the interleaved systematic symbol streams to the interlaced parity symbol streams; and selecting symbols to be transmitted according to a given data rate, from the concatenated symbols.

In accordance with a ninth aspect of the present invention, there is provided an apparatus for decoding all or some of the received code symbols generated by encoding an information symbol stream according to a given code rate using a Quasi-Complementary Duo-Binary Turbo Code (QC-DBTC) encoder. The apparatus comprises a selector for inserting a predetermined code symbol in a position corresponding to a punctured symbol among received symbols; a deinterlacer for deinterlacing parity symbols among the symbols generated by the selector; a quad-symbol mapper for quad-mapping systematic symbols among the symbols generated by the selector; a plurality of deinterleavers for independently deinterleaving the quad-mapped systematic symbol streams and the deinterlaced parity symbol streams; a quad-symbol demapper for quad-demapping the deinterleaved systematic symbol stream; a code symbol concatenator for concatenating an output of the quad-symbol demapper to the deinterleaved parity symbol streams; and a QC-DBTC decoder for QC-DBTC decoding the concatenated symbol streams.

BRIEF DESCRIPTION OF THE DRAWINGS

The above and other objects, features and advantages of the present invention will become more apparent from the following detailed description when taken in conjunction with the accompanying drawings in which.

Throughout the drawings, like reference numerals will be understood to refer to like parts, components and structures.

DETAILED DESCRIPTION OF EXEMPLARY EMBODIMENTS

Several exemplary embodiments of the present invention will now be described in detail with reference to the annexed drawings. In the following description, a detailed description of known functions and configurations incorporated herein has been omitted for conciseness.

Figure 4:
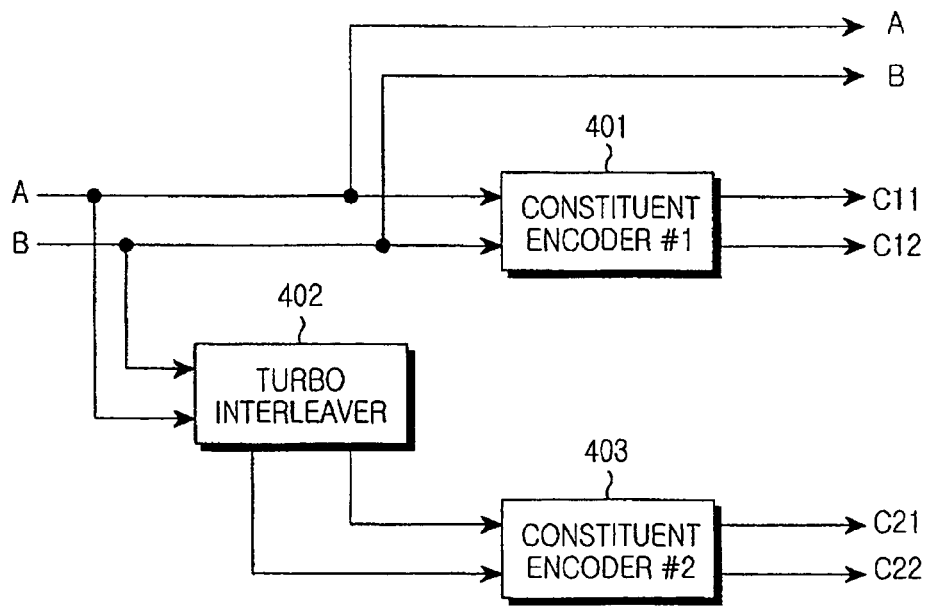
FIG. 4 is a block diagram illustrating an apparatus for generating R=1/3 duo-binary turbo codes.
Figure 6:
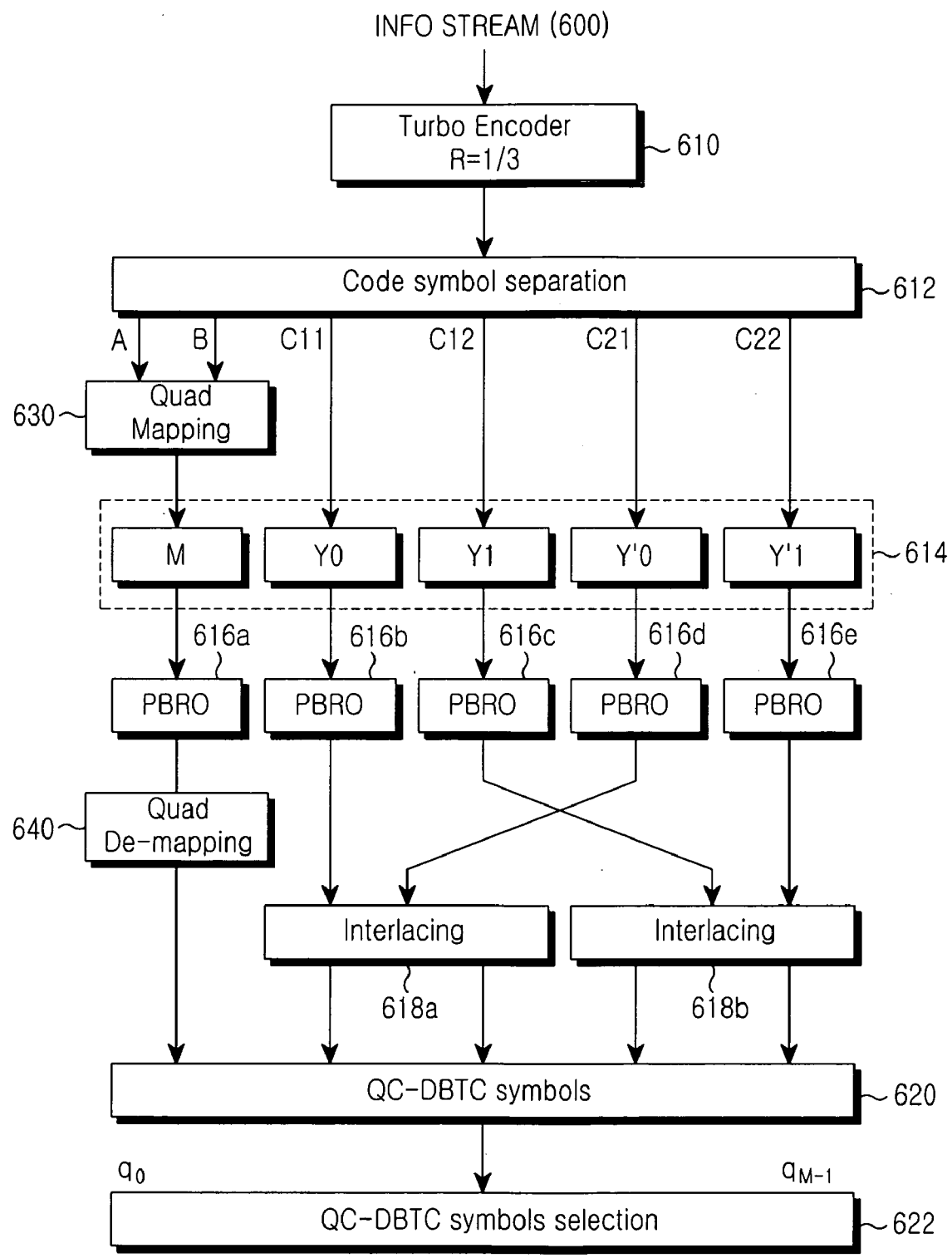
FIG. 6 is a block diagram illustrating a structure of a QC-DBTC encoder having a code rate R=1/3 and using duo-binary turbo codes according to an embodiment of the present invention.

FIG. 6 is a block diagram illustrating a structure of a QC-DBTC encoder having a code rate R=1/3 and using duo-binary turbo codes according to an embodiment of the present invention. With reference to FIG. 6, a detailed description will now be made of a structure and operation of a QC-DBTC encoder having a code rate R=1/3 and using duo-binary turbo codes according to an embodiment of the present invention. In FIG. 6, a turbo encoder 610 is substantially identical in structure to that of the turbo encoder described with reference to FIG. 4. FIG. 4 is a block diagram illustrating an apparatus for generating R=1/3 duo-binary turbo codes. Therefore, an internal structure of the turbo encoder 610 will be described with reference to FIG. 4.

Figure 1:
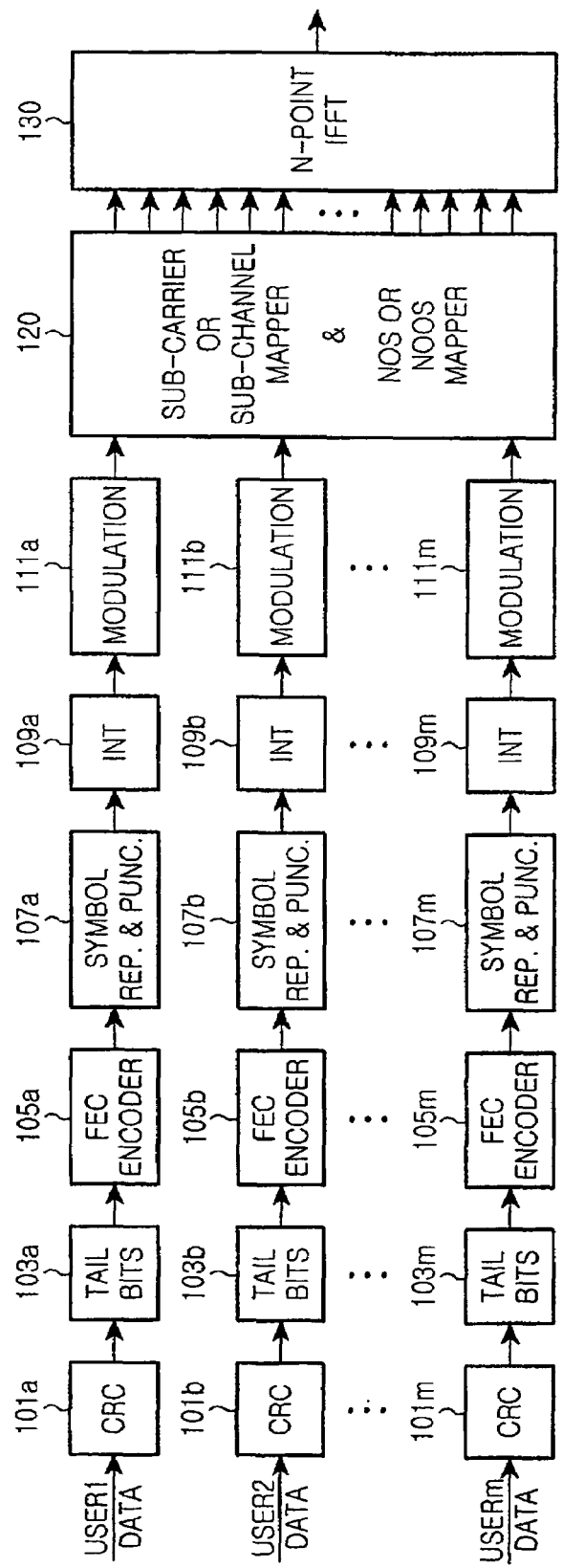
FIG. 1 is a block diagram illustrating structures of physical channels for transmitting high-rate data to a user in an IEEE 802.16a system using Orthogonal Frequency Division Multiplexing (OFDM)
Figure 2:
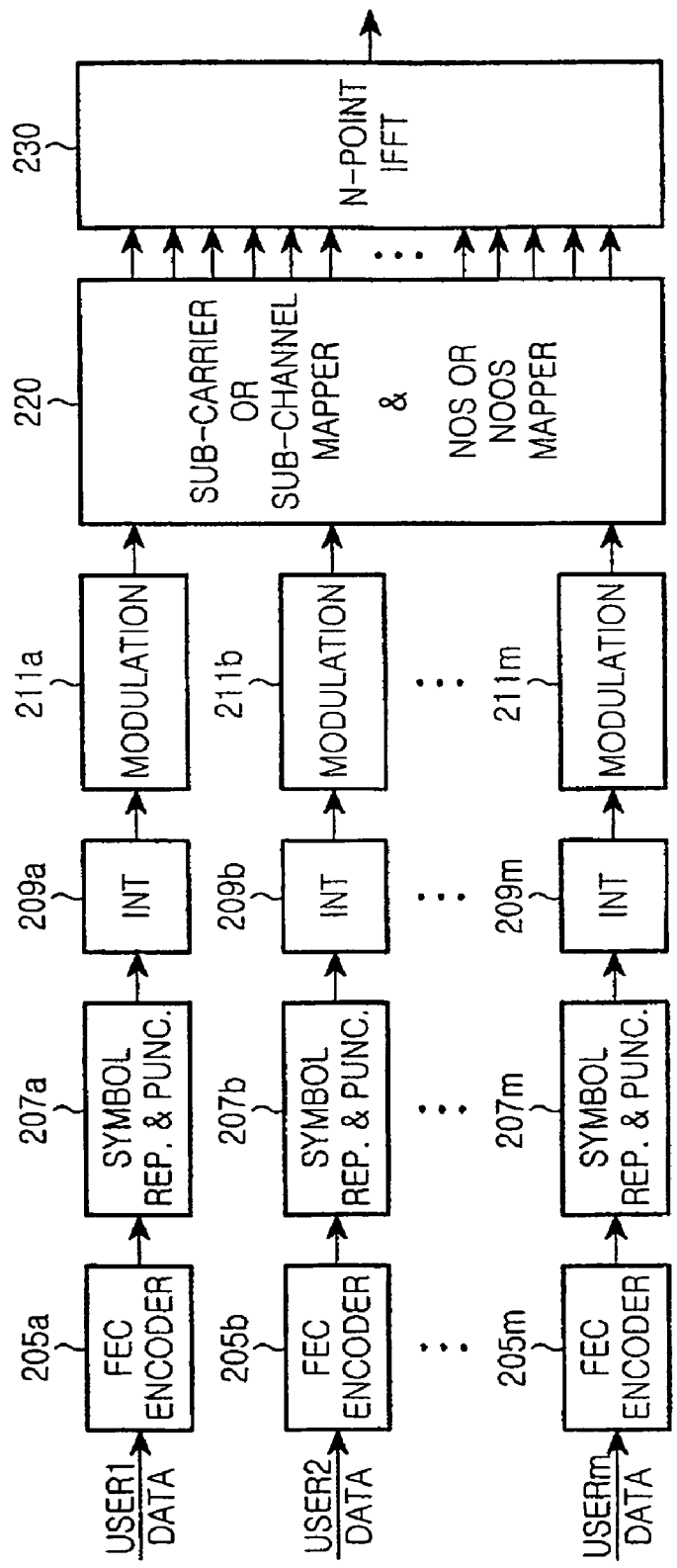
FIG. 2 is a block diagram illustrating structures of physical channels for transmitting data to a user in a current HPi high-rate data system.
Figure 3:
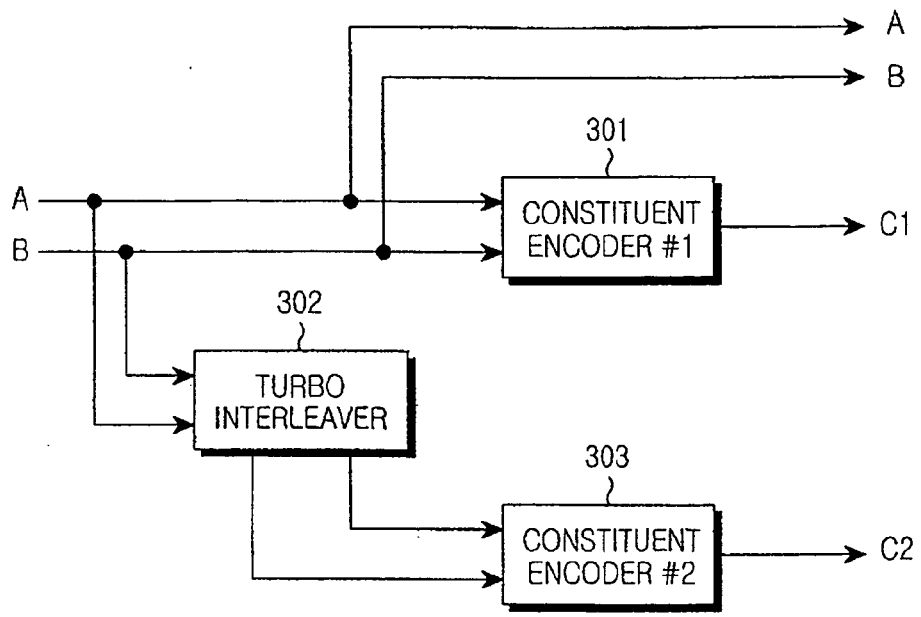
FIG. 3 is a block diagram illustrating an apparatus for generating rate R=1/2 duo-binary turbo codes.

The QC-DBTC encoder illustrated in FIG. 6 is similar in structure to a conventional QCTC encoder using binary turbo codes except for the inclusion of a process of processing systematic symbols. This is required because in the case of duo-binary turbo codes, as illustrated in FIGS. 3 and 4, N_EP systematic symbols are divided into systematic symbol streams A and B, each comprised of N_EP/2 systematic symbols. Respective symbols A_i and B_i are encoded in pairs by a first constituent encoder 401, or encoded in pairs by a second constituent encoder 403 after being turbo-interleaved by a turbo interleaver 402. That is, each of information stream pairs A and B is defined as an information stream pair defined by one transition process on a trellis diagram of each constituent encoder, and a size of the symbol streams is defined as N_EP/2. Therefore, the QC-DBTC encoder receiving the information stream pairs performs symbol classification based on the symbol pairs A_i and B_i as illustrated in FIG. 6. That is, A_i and B_i are mapped to quad-symbols before being block-interleaved.

The encoding process will now be described in detail. For convenience, the description will be made herein with reference to rate R=1/3 duo-binary turbo codes. However, the encoding process can also be applied to duo-binary turbo codes having a code rate 1/2 or other code rates without a change in structure or encoding scheme of the duo-binary turbo codes. The change in code rate simply increases the number of parity symbol groups so that the code rate is reduced.

Encoding Process

Step 1: Output Symbol Classification of Duo-Binary Turbo Codes

Figure 5:
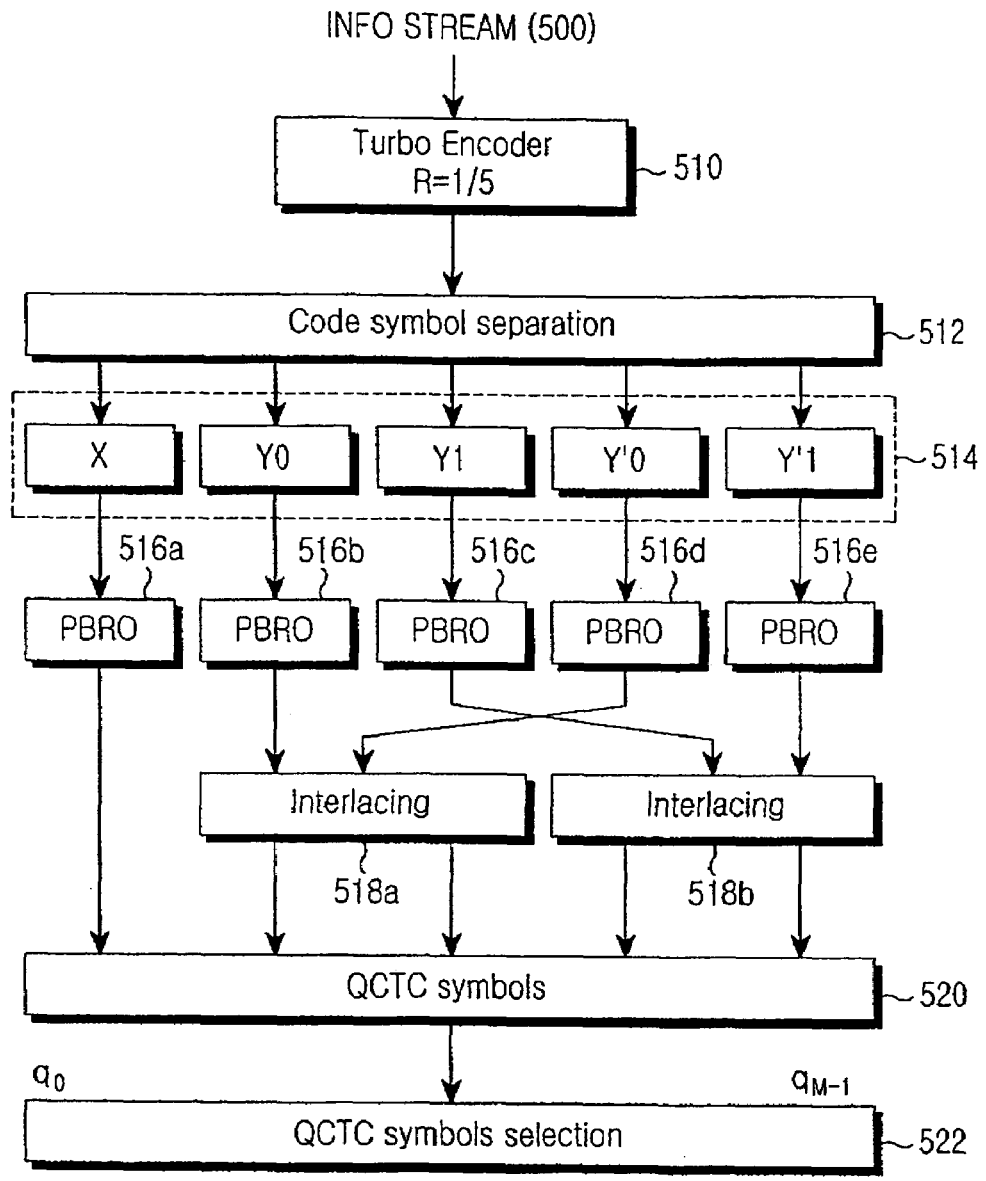
FIG. 5 is a block diagram illustrating a QCTC symbol generator in a CDMA2000 1x EV-DV system.

Referring to FIG. 6, the turbo encoder 610 using R=1/3 duo-binary turbo codes as mother codes, performs turbo coding on N_EP input information symbols. The turbo coding process is substantially identical to the conventional duo-binary turbo coding process. Therefore, the duo-binary turbo encoder 610 generates 3×N_EP code symbols. Reference numeral 612 shows a process of separating output symbols of the duo-binary turbo encoder 610 into systematic symbols and parity symbols, and then concatenating the separated symbols. Among the code symbols generated in this manner, systematic symbols are divided into two systematic symbol streams A and B, each comprised of N_EP/2 symbols, and parity symbols are divided into four parity symbol streams C11, C12, C21 and C22, each comprised of N_EP/2 symbols, as illustrated in FIG. 6. It can be noted that the number of sub-blocks of systematic symbols in the QC-DBTC coding scheme is higher by one than in the conventional QCTC coding scheme of FIG. 5. A mapping relation of the input systematic symbols will now be described. If input systematic symbols are denoted by S(k) (wherein k=0, 1, 2, 3, ..., N_EP-1), A_i and B_i are defined as in Equation (1) and Equation (2), respectively, shown below.

$$A\_i = S(2i), \text{ where } i=0,1,2,3,\ldots,N\_EP/2-1 \quad (1)$$

$$B\_i = S(2i+1), \text{ where } i=0,1,2,3,\ldots,N\_EP/2-1 \quad (2)$$

Step 2: Quad-Symbol Mapping of Systematic Symbols

As illustrated in FIG. 6, the systematic symbol streams A and B are mapped to quad-symbols in accordance with a quad-symbol mapping table described in greater detail below. The quad-symbol mapping is performed by a quad-symbol mapper 630 in such a manner that A_i and B_i are mapped to m_i (wherein i=0, 1, 2, ..., N_EP/2-1). This is equivalent to calculating A_i and B_i in accordance with Equation (1) and Equation (2). Therefore, a newly generated systematic symbol stream M has a size of N_EP/2. There are various possible mapping rules between A_i, B_i, and m_i. Herein, a mapping rule for mapping A_i and B_i to m_i by binary expression will be used as a typical example of the possible mapping rules. Regardless of the mapping rule used, it is important that the new systematic symbol stream M has a size of N_EP/2 by quad-symbol mapping like the conventional binary QCTC, and that each quad-symbol is mapped to an ith systematic symbol pair A_i and B_i. A quad-symbol mapping table is illustrated below in Table 1.

TABLE 1

| (A_i, B_i) i = 0, 1, 2, ..., N_EP/2-1 | m_i, i = 0, 1, 2, ..., N_EP/2-1 | Mapping rule |
|---|---|---|
| (0, 0) | m_i = 0 | 2 × A_i + B_i |
| (0, 1) | m_i = 1 | 2 × A_i + B_i |
| (1, 0) | m_i = 2 | 2 × A_i + B_i |
| (1, 1) | m_i = 3 | 2 × A_i + B_i |

Table 1 illustrates an example of a mapping rule between systematic symbols A_i and B_i, and a quad-symbol m_i.

Step 3: Classification of Parity Symbols

Next, the code symbols are separated into a systematic symbol group (or sub-block M) and a plurality of parity symbol groups (or sub-blocks Y0, Y1, Y'0, and Y'1), and then demultiplexed into 5 sub-blocks. Here, this operation is defined as "code symbol separation", and is denoted by reference numeral 614 in FIG. 6. The code symbol separator 614 is substantially identical in operation to the conventional QCTC symbol separator 514. An operation performed by the code symbol separator 614 can be expressed as in Equation (3) to Equation (6) shown below.

$$Y0\_i = C11\_i, \text{ where } i=0,1,2,3,\ldots,N\_EP/2-1 \quad (3)$$

$$Y1\_i = C12\_i, \text{ where } i=0,1,2,3,\ldots,N\_EP/2-1 \quad (4)$$

$$Y'0\_i = C21\_i, \text{ where } i=0,1,2,3,\ldots,N\_EP/2-1 \quad (5)$$

$$Y'1\_i = C22\_i, \text{ where } i=0,1,2,3,\ldots,N\_EP/2-1 \quad (6)$$

Step 4: Sub-block Interleaving and Interlacing

Next, the respective sub-blocks undergo independent interleaving, and this is called "sub-block interleaving". The sub-block interleaving is achieved by the PBRO interleavers 616a, 616b, 616c, 616d, and 616e. Here, all of the sub-blocks have the same size of N_EP/2. Subsequently, parity symbols Y0 and Y'0 generated in each sub-block are interlaced and then rearranged, generating a new group. Similarly, parity symbols Y1 and Y'1 generated in each sub-block are also interlaced and then rearranged, generating a new group. Here, each of the groups, or parity symbol streams, has a size of N_EP/2. The interlacing is achieved by interlacers 618a and 618b.

Step 5: Quad-Symbol Inverse Mapping of Systematic Symbols

Next, N_EP/2 systematic symbols are calculated from a systematic symbol stream M' newly generated by sub-block interleaving, by demapping (inverse-mapping) a quad-symbol back to binary symbols A_i' and B_i' in accordance with Table 1. Referring to Table 1, A_i and B_i' can be regarded as A_i' and B_i', respectively. For example, m_i=3 is mapped to (A_i, B_i)=(1,1). As described above, there are various possible mapping rules, and the present invention has no limitation on the mapping rules. The mapping of m_i can be expressed as in Equation (7) below.

$$m\_i' \rightarrow (A\_i', B\_i'), \text{ where } i=0,1,2,\ldots,N\_EP/2-1 \quad (7)$$

The quad-demapping in accordance with Equation (7) or other methods is achieved by a quad-symbol demapper 640.

Step 6: QC-DBTC Symbol Concatenation

Next, a sub-block comprised of interleaved systematic symbols and 2 interlaced parity groups are rearranged in a regular order and then concatenated, thus generating one new sequence. Here, this operation is denoted by "QC-DBTC Symbols" and reference numeral 620 in FIG. 6. Through a series of the processes described above, symbol rearrangement for generating QC-DBTC codes is completed. The QC-DBTC symbol rearrangement can be expressed as in Equation (8) below.

$$QC\text{-}DBTC = \{A'|B'|ITR(Y0, Y'0)|ITR(Y1, Y'1)\} \quad (8)$$

In Equation (8), {a|b} denotes a new sequence obtained by serial-concatenating two sequences 'a' and 'b', and ITR(a,b) denotes mutual-interlacing of two sequences 'a' and 'b'. That is, the sequences 'a' and 'b' are interlaced in the order of a_0, b_0, a_1, b_1, a_2, b_2, ..., a_M, b_M.

Step 7: QC-DBTC Symbol Selection

Next, a QC-DBTC symbol selector 622 generates QC-DBTC codes having various code rates by selecting random symbols from 3×N_EP symbols. A scheme for generating the QC-DBTC codes having various code rates is well disclosed in Korean Patent Application No. P2001-0007357, entitled "Code Generating Apparatus and Method in a Code System," filed by the applicant, the entire content of which is incorporated herein by reference.

As described above, QC-DBTC is different from the conventional binary QCTC in Step 2 and Step 5. The reason for using the quad-symbol mapping is as follows.

First, the use of the quad-symbol mapping makes a size of the systematic symbol groups be equal to a size of the parity symbol groups. Therefore, a transmitter includes only one sub-block interleaving device. That is, the use of the same sub-block size contributes to a simplification of the parameters and algorithm for sub-block interleaving. Generally, PBRO interleaving is used as the sub-block interleaving.

Second, as the use of the quad-symbol mapping makes a size of the systematic symbol groups be equal to a size of the parity symbol groups, a receiver also includes only one sub-block interleaving device. The receiver preferably implements sub-block interleaving using an inverse function of the interleaving used in the transmitter, and generally, the use of an inverse function for interleaving causes an increase in implementation complexity of deinterleaving. In addition, the use of different sub-block sizes causes an increase in implementation complexity in proportion thereto. Therefore, the use of the same sub-block size enables the use of a single inverse function, contributing to a reduction in complexity of the receiver.

Third, the use of the quad-symbol mapping can improve a channel interleaving depth as compared with a scheme for separately sub-block-interleaving systematic symbol streams A and B. It is well disclosed in related references that an increase in channel interleaving depth generally improves interleaving performance. In particular, the channel interleaving depth is an important performance parameter in a mobile communication system, and as noted above in regard to the conventional binary QCTC, QCTC has a structure of integrating FEC coding and channel interleaving into one scheme. Therefore, even though QCTC has the same coding gain, it is preferable because of its structure to improve performance of channel interleaving. In this context, the quad-symbol mapping structure can extend a channel interleaving area of systematic symbols up to N_EP. However, the scheme for separately sub-block-interleaving systematic symbol streams A and B is limited to N_EP/2 in terms of channel interleaving area.

Figure 7:
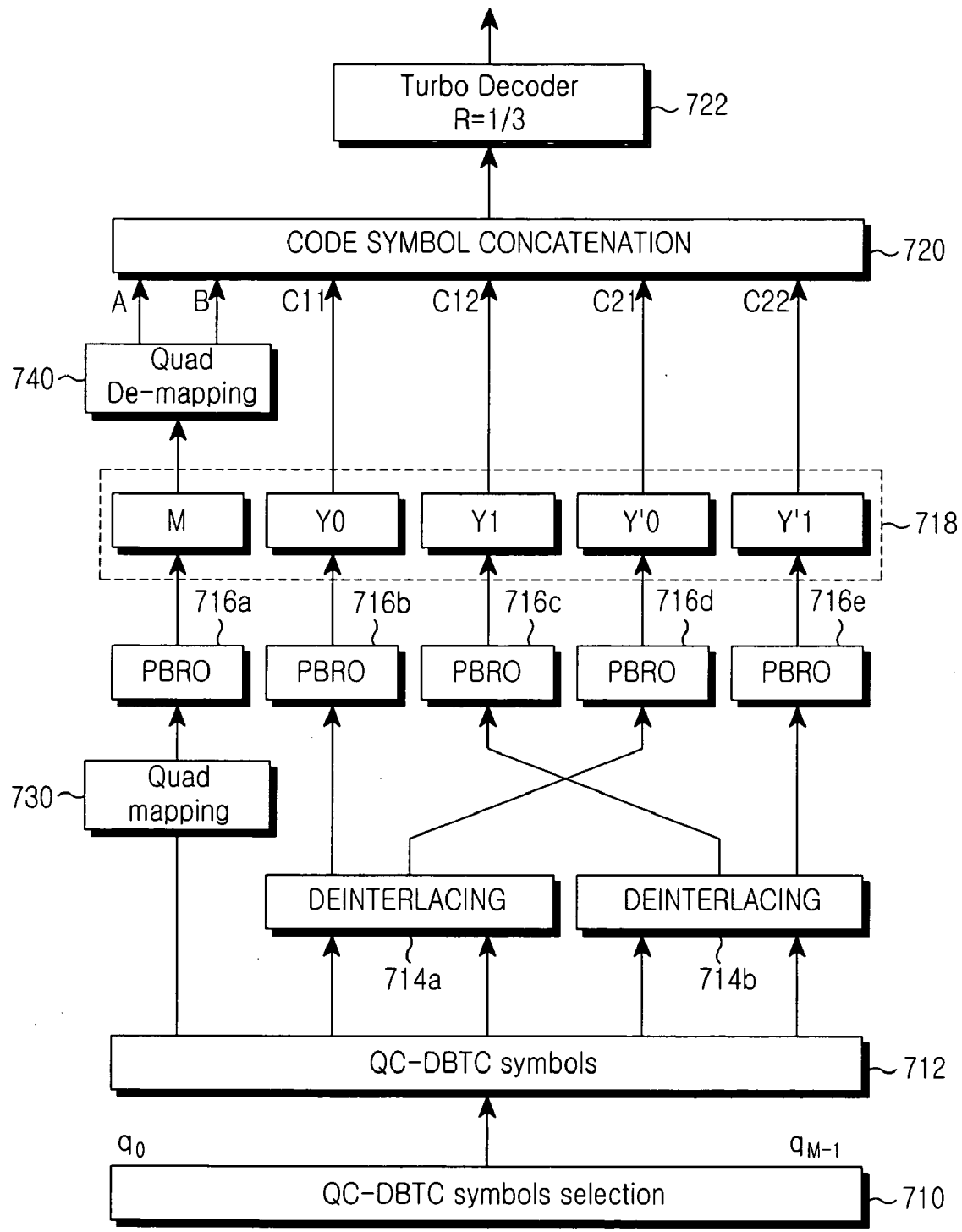
FIG. 7 is a block diagram illustrating a structure of a receiver in a QC-DBTC system according to an embodiment of the present invention.

FIG. 7 is a block diagram illustrating a structure of a receiver in a QC-DBTC system according to an embodiment of the present invention. With reference to FIG. 7, a detailed description will now be made of a structure and operation of a receiver in a QC-DBTC system according to an embodiment of the present invention.

The receiver performs an inverse process of QC-DBTC used in the transmitter, and restores N_EP systematic symbols from received codeword symbols. With reference to FIG. 7, a description will now be made of a process of restoring systematic symbols. A QC-DBTC symbol selector 710 converts received symbols $q_0, q_1, \ldots, q_{M01}$ to quad-symbols comprised of parity symbols and systematic symbols. The quad-symbols are denoted by reference numeral 712. Because the quad-symbols are separately comprised of systematic symbols and parity symbols, the systematic symbols are output intact and the parity symbols are divided into interlaced symbols 714a and 714b. The interlaced symbols 714a and 714b are separated into corresponding parity symbols through a deinterlacing process. The systematic symbols are mapped to quad-symbols by a quad-symbol mapper 730. The parity symbol streams separated through the deinterlacing process and the systematic symbol stream are input to their associated PBRO processors 716a, 716b, 716c, 716d, and 716e, and the PBRO processors 716a, 716b, 716c, 716d, and 716e PBRO-rearrange the input symbols. The output symbols 718 of the PBRO processors 716a, 716b, 716c, 716d, and 716e are equal to the output symbols of the code symbol separator 614 of FIG. 6.

It should be noted herein that because N_EP systematic symbols q_k (wherein k=0, 1, 2, 3, . . . , N_EP-1) have real values, the receiver, unlike the transmitter, cannot quad-symbol-map the systematic symbols to (0,0), (0,1), (1,0), (1,1) as shown in Table 1. Therefore, symbol positions (q_k, q_k+1) (where k=0, 2, 4, . . . , N_EP-2) corresponding to A_i' and B_i' are concatenated into one symbol pair (q_k, q_k+1), wherein the symbol pair is regarded a quad-symbol and size-N_EP/2 PBRO interleaving is achieved. That is, what is preferably done is to simply match the symbol positions of q_k and q_k+1. An example of such a mapping rule is illustrated in Table 2.

TABLE 2

| (q_k, q_k + 1) <br> k = 0, 2, . . . , N_EP-2 | m_i, i = 0, 1, 2, . . . , <br> N_EP/2-1 | Mapping rule |
| --- | --- | --- |
| (q_k, q_k + 1) | m_i = (q_k, q_k + 1) | i = k/2 |

In the same manner, parity symbols are divided into 4 parity blocks by deinterlacing, and the parity blocks are divided into Y0, Y1, Y'0 and Y'1, respectively, and then converted to C11, C12, C21 and C22, by PBRO sub-block deinterleaving. Also, the systematic symbols M' are restored to their original order by PBRO sub-block deinterleaving.

Next, a quad-symbol demapper 740 converts m_i (wherein i=0, 1, 2, . . . , N_EP-1) to (A_i, B_i) through an inverse process of the transmitter. Next, all of 3N_EP code symbols obtained by concatenating A, B, C11, C12, C21 and C22 are input to a duo-binary turbo encoder 722. For reference, when a code rate is higher than 1/3, the number of symbols actually transmitted is less than 3N_EP, and in this case, an erasure symbol is added to q_i corresponding to a symbol position where no symbol is transmitted and a QC-DBTC reception operation is performed in the foregoing process.

Figure 8:
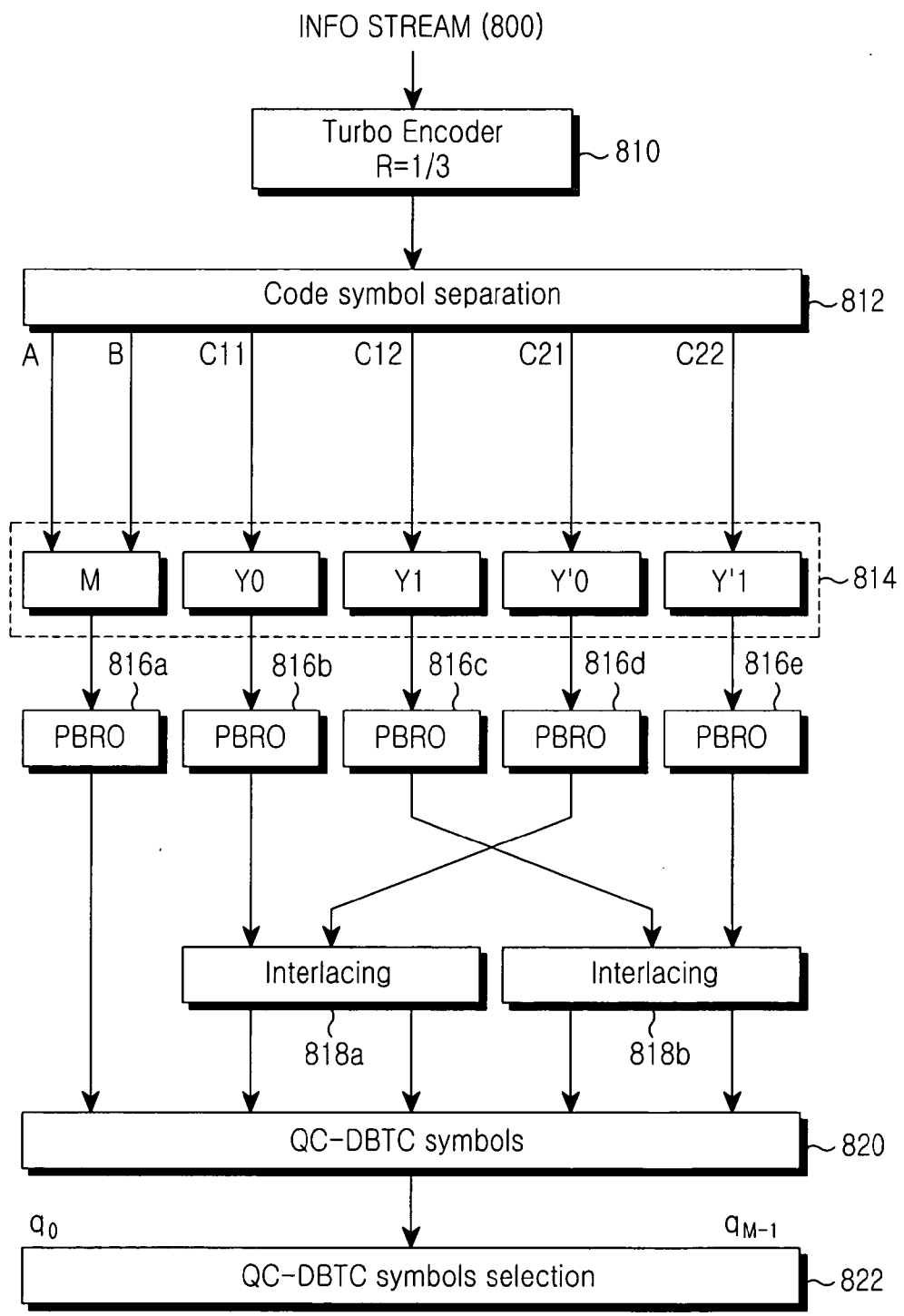
FIG. 8 is a block diagram illustrating a structure of a transmitter in a QC-DBTC system according to another embodiment of the present invention.

FIG. 8 is a block diagram illustrating a structure of a transmitter in a QC-DBTC system according to another embodiment of the present invention. In FIG. 8, only the scheme for extending a size of the systematic symbols to N_EP is described in detail.

As illustrated in FIG. 8, the scheme is substantially the same as the conventional QCTC scheme in structure, but different in that the scheme of FIG. 8 uses a binary turbo encoder. Also, compared with the structure of FIG. 6, the structure of FIG. 8 does not include a quad-symbol mapper and a quad-symbol demapper. The structure of FIG. 8 is substantially identical to the structure of FIG. 6 except for the absence of a quad-symbol mapper and a quad-symbol demapper, and only those differences in structure and function between them will be described. As can be understood from FIG. 8, systematic symbols among the code symbols output from a turbo encoder 810 are doubled in terms of size of a PBRO sub-block interleaver 816a associated with the systematic symbols, while all of the PBRO sub-block interleavers 616a to 616e for the conventional QCTC codeword have same size. Systematic symbol streams A and B are alternately arranged in the order of A_0, B_0, A_1, B_1, A_2, B_2, . . . , A_(N_EP/2-1), B_(N_EP/2-1), and then input to the PBRO sub-block interleaver 816a. Such a structure is advantageous in that channel interleaving is performed on a per-binary symbol basis, that is, on a per-bit basis, thereby improving randomness of channel interleaving. However, this scheme is disadvantageous in that, because the sub-block for systematic symbols is different in size from the sub-blocks for parity symbols, a transmitter and a receiver both require two PBRO sub-block interleaving devices. However, because a channel interleaving depth is extended to N_EP in the QC-DBTC scheme illustrated in FIG. 6, a difference between the extended channel interleaving depth and a bit-basis channel interleaver depth of FIG. 8 is negligible.

Figure 9:
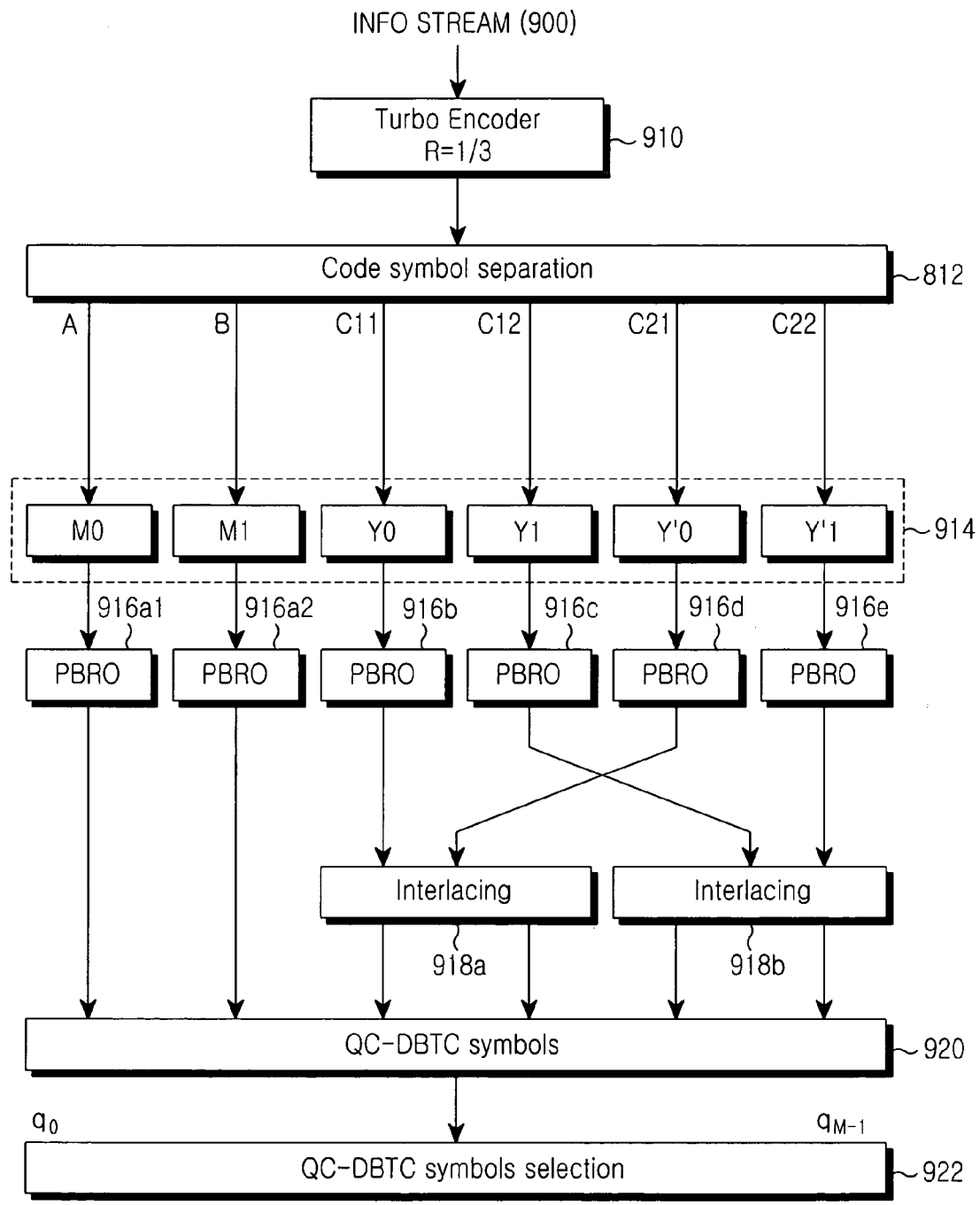
FIG. 9 is a block diagram illustrating a structure of a transmitter in a QC-DBTC system according to another embodiment of the present invention.

In another alternative embodiment, only a binary turbo encoder is used while a structure of a QCTC code generation apparatus remains unchanged. In this embodiment, because the number of systematic symbols output from the binary turbo encoder is doubled unlike that in the QCTC scheme, the number of sub-block interleavers is extended to 2 (M0 and M1). Therefore, all of the sub-block interleavers have the same size of N_EP/2, like those in FIG. 6. Such a scheme is illustrated in FIG. 9. Here, only the differences between the structure and function of FIG. 9 and FIG. 6 will be described.

The scheme of FIG. 9 has two PBRO sub-block interleavers for systematic symbols. In FIG. 9, sub-block interleavers 916a1 and 916a2 for systematic symbols have the same size as that of sub-block interleavers 916b, 916c, 916d and 916d for parity symbols. Therefore, the systematic symbol streams A and B are sequentially arranged in their associated sub-blocks M0 and M1, subjected to independent PBRO sub-block interleaving, and then sequentially arranged in a QC-DBTC symbol stream.

Such a structure is advantageous in that channel interleaving is performed on a per-binary symbol basis, that is, on a per-bit basis, and all of the sub-blocks can use the same-sized PBRO interleaving devices. However, this scheme is disadvantageous in that, because the sub-blocks for the systematic symbols have a small size of N_EP/2 and are arranged in parallel in a QC-DBTC symbol stream, a channel interleaving depth is limited to N_EP/2 as compared with the conventional scheme of FIG. 6.

As described above, the present invention can generate codes having various code rates in a high-rate wireless data system in which a duo-binary turbo code for selecting one of multiple modulation schemes and one of multiple FEC coding schemes before transmission is used as a mother code. In HARQ, the present invention can provide various sub-codewords and redundancies with a simple QC-DBTC encoder, thereby maximizing transmission efficiency of the system.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus for generating Quasi-Complementary Duo-Binary Turbo Codes (QC-DBTC), comprising:
   a duo-binary turbo encoder having a plurality of constituent encoders for receiving an information symbol stream, and for generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders;
   a quad-symbol mapper for quad-mapping the systematic symbol streams to one symbol stream;
   a channel interleaver for independently interleaving the quad-mapped systematic symbol stream and the parity symbol streams from the constituent encoders, quad-demapping the quad-mapped systematic symbol stream, interlacing symbols in the parity symbol streams corresponding to each other from among the interleaved parity symbol streams, and serial-concatenating the quad-demapped systematic symbol stream to the interlaced parity symbol streams; and
   a duo-binary turbo code generator for repeating the serial-concatenated symbol stream, and for selecting a predetermined number of symbols from the repeated symbol stream according to a code rate and selection information thereby generating QC-DBTC codes.

2. The apparatus of claim 1, wherein the quad-mapped systematic symbol stream output from the quad-symbol mapper is 1/2 the size of the systematic symbol streams.

3. The apparatus of claim 1, wherein the quad-mapped systematic symbol stream output from the quad-symbol mapper is equal in size to the QC-DBTC codes.

4. The apparatus of claim 1, wherein the quad-mapped systematic symbol stream output from the quad-symbol mapper is equal in size to the parity symbol streams.

5. The apparatus of claim 1, wherein the channel interleaver comprises:
   a plurality of interleavers for independently interleaving the quad-mapped systematic symbol stream and the parity symbol streams output from the constituent encoders;
   a quad-symbol demapper for quad-demapping the quad-mapped systematic symbol stream;
   an interlacer for interlacing the interleaved parity symbols; and
   a symbol concatenator for serial-concatenating the quad-demapped symbols to the interlaced symbols.

6. The apparatus of claim 1, wherein a code rate of the duo-binary turbo encoder is 1/3.

7. A method for generating Quasi-Complementary Duo-Binary Turbo Codes (QC-DBTC), comprising the steps of:
   receiving an information symbol stream and generating a plurality of systematic symbol streams and a plurality of parity symbol streams according to a given code rate;
   separating the generated symbol streams into systematic symbol streams and parity symbol streams;
   quad-mapping the separated systematic symbol streams to one symbol stream;
   independently interleaving the quad-mapped symbol stream and the parity symbol streams;
   quad-demapping the interleaved systematic symbol stream;
   interlacing the parity symbol streams in pairs;
   concatenating the interlaced parity symbol streams to the quad-demapped systematic symbol stream; and
   selecting symbols to be transmitted according to a given data rate from the concatenated symbols.

8. The method of claim 7, wherein the interleaving step comprises the steps of:
   independently interleaving the quad-mapped systematic symbol stream and the parity symbol streams;
   quad-demapping the quad-mapped systematic symbol stream;
   interlacing the interleaved parity symbol streams; and
   serial-concatenating the quad-demapped systematic symbol stream to the interlaced parity symbol streams.

9. An apparatus for generating code symbols by encoding an information symbol stream according to a given code rate using a Quasi-Complementary Duo-Binary Turbo Code (QC-DBTC) encoder and selecting all or some of the code symbols to be transmitted from among the generated code symbols, the apparatus comprising:
   a QC-DBTC encoder for receiving an information symbol stream and generating QC-DBTC symbols according to a predetermined code rate;
   a separator for separating output symbols of the QC-DBTC encoder into a plurality of systematic symbol streams and a plurality of parity symbol streams, the systematic symbol streams being connected into one symbol stream;
   a plurality of interleavers for independently interleaving the parity symbol streams;
   a systematic symbol stream interleaver for interleaving the connected systematic symbol stream;
   an interlacer for interlacing the parity symbol streams in pairs;
   a concatenator for serial-concatenating an output of the systematic symbol stream interleaver to an output of the interlacer; and
   a symbol selector for selecting symbols to be transmitted according to a given data rate from the concatenated symbols.

10. The apparatus of claim 9, wherein the separator interlaces the systematic symbol streams into one systematic symbol stream.

11. The apparatus of claim 9, wherein the systematic symbol stream interleaver is two times larger in size than the interleavers for interleaving the parity symbol streams.

12. A method for generating code symbols by encoding an information symbol stream according to a given code rate using a Quasi-Complementary Duo-Binary Turbo Code (QC-DBTC) encoder and selecting all or some of the code symbols to be transmitted from among the generated code symbols, the method comprising the steps of:
   receiving an information symbol stream and generating QC-DBTC symbols according to a predetermined code rate;
   separating output symbols of the QC-DBTC encoder into a plurality of systematic symbol streams and a plurality of parity symbol streams, the systematic symbol streams being connected into one symbol stream;
   independently interleaving the parity symbol streams;
   interleaving the connected systematic symbol stream;
   interlacing the parity symbol streams in pairs;

serial-concatenating the interleaved systematic symbol stream to the interlaced parity symbol streams; and selecting symbols to be transmitted according to a given data rate from the concatenated symbols.

13. An apparatus for generating code symbols by encoding an information symbol stream according to a given code rate using a Quasi-Complementary Duo-Binary Turbo Code (QC-DBTC) encoder and selecting all or some of the code symbols to be transmitted from among the generated code symbols, the apparatus comprising:

- a QC-DBTC encoder having a plurality of constituent encoders for receiving an information symbol stream, and for generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders;
- a separator for separating an output of the QC-DBTC encoder into systematic symbol streams and parity symbol streams;
- a plurality of interleavers for independently interleaving the systematic symbol streams and the parity symbol streams;
- an interlacer for interlacing in pairs, the parity symbol pairs generated from different constituent encoders;
- a concatenator for serial-concatenating the interleaved systematic symbol streams to the interlaced parity symbol streams; and
- a symbol selector for selecting symbols to be transmitted according to a given data rate from the concatenated symbols.

14. A method for generating code symbols by encoding an information symbol stream according to a given code rate using a Quasi-Complementary Duo-Binary Turbo Code (QC-DBTC) encoder and selecting all or some of the code symbols to be transmitted from among the generated code symbols, the method comprising the steps of:

receiving by the QC-DBTC encoder, an information symbol stream, and generating a plurality of systematic symbol streams and a plurality of parity symbol streams according to a given code rate, wherein the parity symbol streams are generated from the constituent encoders associated thereto and the parity symbol streams from one of the constituent encoders correspond to the parity symbol streams from another one of the constituent encoders;

separating an output of the QC-DBTC encoder into systematic symbol streams and parity symbol streams;

independently interleaving the systematic symbol streams and the parity symbol streams;

interlacing the parity symbol streams in pairs;

concatenating the interleaved systematic symbol streams to the interlaced parity symbol streams; and selecting symbols to be transmitted according to a given data rate from the concatenated symbols.

15. An apparatus for decoding all or some of the received code symbols generated by encoding an information symbol stream according to a given code rate using a Quasi-Complementary Duo-Binary Turbo Code (QC-DBTC) encoder, the apparatus comprising:

- a selector for inserting a predetermined code symbol in a position corresponding to a punctured symbol among received symbols;
- a deinterlacer for deinterlacing parity symbols among the symbols generated by the selector;
- a quad-symbol mapper for quad-mapping systematic symbols among the symbols generated by the selector;
- a plurality of deinterleavers for independently deinterleaving the quad-mapped systematic symbol streams and the deinterlaced parity symbol streams;
- a quad-symbol demapper for quad-demapping the deinterleaved systematic symbol stream;
- a code symbol concatenator for concatenating an output of the quad-symbol demapper to the deinterleaved parity symbol streams; and
- a QC-DBTC decoder for QC-DBTC decoding the concatenated symbol streams.

* * * * *